(12) United States Patent
Yamaguchi et al.

(10) Patent No.: US 10,361,229 B2
(45) Date of Patent: Jul. 23, 2019

(54) DISPLAY DEVICE

(71) Applicant: Japan Display Inc., Tokyo (JP)

(72) Inventors: Yohei Yamaguchi, Tokyo (JP); Isao Suzumura, Tokyo (JP); Hidekazu Miyake, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/004,546

(22) Filed: Jun. 11, 2018

(65) Prior Publication Data

US 2018/0294286 A1 Oct. 11, 2018

Related U.S. Application Data

(63) Continuation of application No. 15/479,392, filed on Apr. 5, 2017, now abandoned.

(30) Foreign Application Priority Data

May 6, 2016 (JP) ................................. 2016-093071

(51) Int. Cl.
*H01L 27/12* (2006.01)
*H01L 27/32* (2006.01)
*H01L 29/786* (2006.01)
*G02F 1/1362* (2006.01)
*G02F 1/1368* (2006.01)

(52) U.S. Cl.
CPC ........ *H01L 27/1288* (2013.01); *G02F 1/1368* (2013.01); *G02F 1/136227* (2013.01); *H01L 27/124* (2013.01); *H01L 27/127* (2013.01); *H01L 27/1225* (2013.01); *H01L 27/1229* (2013.01); *H01L 27/1233* (2013.01); *H01L 27/1251* (2013.01); *H01L 27/3262* (2013.01); *H01L 27/3276* (2013.01); *H01L 29/78693* (2013.01); *G02F 2201/123* (2013.01); *G02F 2202/104* (2013.01)

(58) Field of Classification Search
CPC ............ H01L 27/1225; H01L 27/1229; H01L 27/1233; H01L 27/1251; H01L 27/127; H01L 27/1274–27/1285; H01L 27/1288

See application file for complete search history.

(56) References Cited

U.S. PATENT DOCUMENTS 9,214,508 B2 * 12/2015 Cho ...................... H01L 27/124
9,412,303 B2 * 8/2016 Kim ...................... G09G 3/3258
(Continued)

FOREIGN PATENT DOCUMENTS

WO    2015/194417 A1    12/2015

*Primary Examiner* — Zandra V Smith
*Assistant Examiner* — Molly K Reida
(74) *Attorney, Agent, or Firm* — Michael Best & Friedrich LLP

(57) ABSTRACT

The invention allows formation of LTPS TFTs and TAOS TFTs on the same substrate. The invention provides a display device including a substrate having a display area in which pixels are formed. The pixels include a first TFT made of a TAOS. The drain of the first TFT is formed of first LTPS 112. The source of the first TFT is formed of second LTPS 113. The first LTPS 112 is connected to a first electrode 106 via a first through-hole 108 formed in an insulating film 105 covering the first TFT. The second LTPS 113 is connected to a second electrode 107 via a second through-hole 108 formed in the insulating film 105 covering the first TFT.

10 Claims, 19 Drawing Sheets

(56) References Cited

U.S. PATENT DOCUMENTS

| | | | |
|---|---|---|---|
| 9,685,469 B2* | 6/2017 | Kim | H01L 27/1248 |
| 9,691,799 B2* | 6/2017 | Lee | H01L 27/1225 |
| 9,721,973 B2* | 8/2017 | Lee | H01L 29/7869 |
| 9,985,055 B2* | 5/2018 | Makita | H01L 27/1225 |
| 2015/0108454 A1 | 4/2015 | Kim | |
| 2017/0125452 A1 | 5/2017 | Ide et al. | |
| 2017/0162606 A1 | 6/2017 | Yan et al. | |
| 2018/0219029 A1* | 8/2018 | Hanyu | H01L 27/1248 |

* cited by examiner

DISPLAY DEVICE

CROSS-REFERENCE TO RELATED APPLICATIONS

This application is a continuation of U.S. application Ser. No. 15/479,392, filed Apr. 5, 2017. Further, this application claims priority from Japanese Patent Application No. 2016-093071 filed on May 6, 2016, the entire contents of which are hereby incorporated by reference into this application.

BACKGROUND OF THE INVENTION

1. Field of the Invention

The present invention relates to display devices and particularly to a display device with a hybrid structure in which polysilicon (poly-Si) TFTs and oxide semiconductor TFTs are used.

2. Description of the Related Art

A typical liquid crystal display device includes a TFT substrate, a counter substrate facing the TFT substrate, and a liquid crystal layer placed therebetween. On the TFT substrate, pixels each having a pixel electrode, a thin film transistor (TFT), and the like are formed in the form of a matrix. Images are produced by controlling the transmittance rate of light passing through the liquid crystal molecules on a pixel-by-pixel basis.

Low-temperature poly-Si (LTPS) is suitable for the TFTs of a driver circuit because it has a high carrier mobility rate. On the other hand, oxide semiconductors are high in off resistance, and the use of such semiconductors in TFTs reduces off current.

There are various problems associated with forming LTPS TFTs and oxide semiconductor TFTs on the same substrate. Patent Application No. WO2015/194417 discloses a structure for forming LTPS TFTs and oxide semiconductor TFTs on the same substrate. As disclosed therein, doped LTPS is used as the gates of the oxide semiconductors.

SUMMARY OF THE INVENTION

The switching TFTs of pixels need to be low in current leakage. Leakage current can be reduced by transparent amorphous oxide semiconductor TFTs. A transparent amorphous oxide semiconductor is hereinafter abbreviated as TAOS. Examples of TAOS's include indium gallium zinc oxide (IGZO), indium tin zinc oxide (ITZO), zinc oxide nitride (ZnON), indium zinc oxide (IZO), indium gallium oxide (IGO), and zinc oxide (ZnO). However, because TAOS's have a low carrier mobility rate, difficulties can be involved in forming the driver circuit, installed in a display device, with using TFTs made of a TAOS. Hereinafter, the term "TAOS" is used to refer also to a TFT made of a TAOS.

On the other hand, TFTs made of LTPS have a high carrier mobility rate. Therefore, such LTPS TFTs can be used in the driver circuit. Hereinafter, the term "LTPS" is used to refer also to a TFT made of LTPS. However, when LTPS is to be used as the switching TFTs of pixels, the typical practice is to connect two LTPS TFTs in series because LTPS is high in current leakage.

Therefore, ideally TAOS's should be used as the switching elements of the pixels in the display area, and LTPS as the TFTs of the peripheral driver circuit. However, there are problems associated with forming LTPS and TAOS's on the same substrate because they differ in material. When source and drain electrodes are formed of LTPS, hydrogen fluoride (HF) cleaning needs to be performed on the LTPS to remove the remaining oxides therefrom. However, because TAOS's will dissolve in HF, the same fabrication process cannot be used for the LTPS and TAOS's.

The present invention is designed to solve the above problems, and an object of the invention is to make it possible to form LTPS TFTs and TAOS TFTs on the same substrate.

The above object is achieved by the following devices.

(1) A display device including a substrate having a display area in which pixels are formed. The pixels include a first TFT made of an oxide semiconductor. The drain of the first TFT is formed of first polysilicon. The source of the first TFT is formed of second polysilicon. The first polysilicon is connected to a first electrode via a first through-hole formed in an insulating film covering the first TFT. The second polysilicon is connected to a second electrode via a second through-hole formed in the insulating film covering the first TFT.

(2) The display device recited in (1) in which the substrate further includes a driver circuit outside the display area, the driver circuit having second TFTs made of polysilicon.

(3) The display device recited in (1) in which a p-n junction is formed between the first polysilicon and the oxide semiconductor or between the second polysilicon and the oxide semiconductor.

DESCRIPTION OF THE PREFERRED EMBODIMENTS

Embodiments of the present invention will now be described in detail.

Embodiment 1

Figure 1:
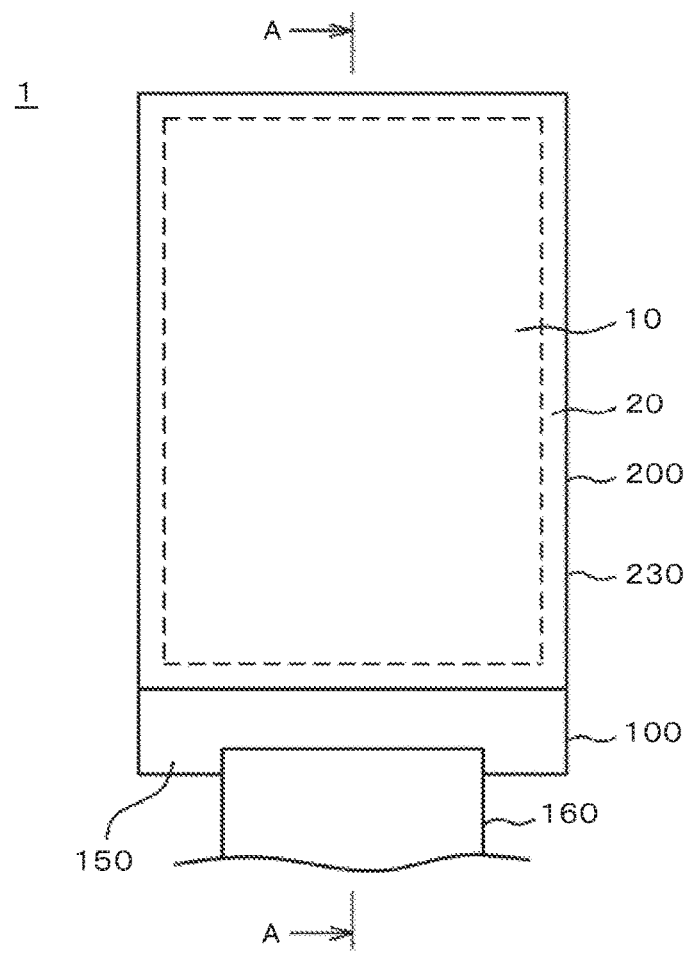
FIG. 1 is a plan view of a liquid crystal display device.
Figure 2:
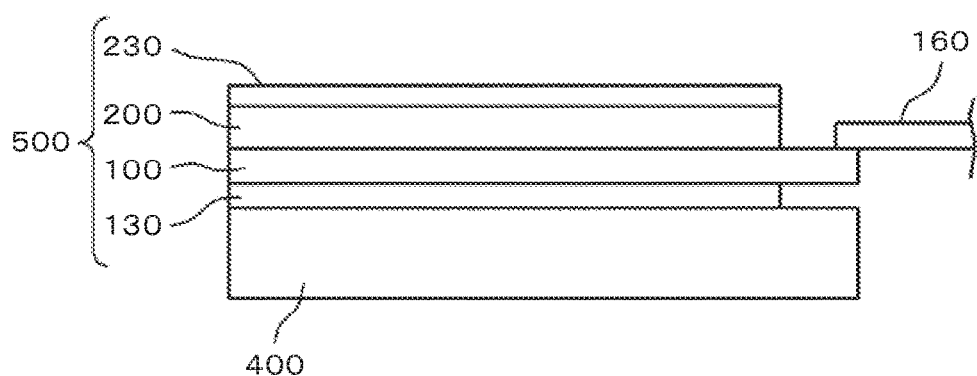
FIG. 2 is a cross section taken along line A-A of FIG. 1.

FIG. 1 is a plan view of a liquid crystal display device to which the invention is applied. FIG. 2 is a cross section taken along line A-A of FIG. 1. As illustrated in FIGS. 1 and 2, a TFT substrate 100 and a counter substrate 200 are disposed to face each other, and a liquid crystal layer is placed therebetween. A lower polarizer 130 is glued to the bottom surface of the TFT substrate 100, and an upper polarizer 230 is glued to the top surface of the counter substrate 200. The structure made up of the TFT substrate 100, the counter substrate 200, the lower polarizer 130, and the upper polarizer 230 is referred to as a liquid crystal display panel 500.

The TFT substrate 100 is formed larger than the counter substrate 200, and the section of the TFT substrate 100 that sticks out serves as a terminal section 150. A flexible wiring substrate 160 is connected to the terminal section 150 to externally supply signals and electric power to the liquid crystal display device. Since the liquid crystal display panel 500 does not emit light by itself, a backlight 400 is disposed on its rear side.

As illustrated in FIG. 1, the liquid crystal display device can be divided into a display area 10 and a peripheral area 20. In the display area 10, a great number of pixels are arranged in the form of a matrix, each of which includes a switching TFT. In the peripheral area 20, a driver circuit is disposed so as to drive gate lines and video signal lines.

Ideally, a TAOS should be used as the TFT of each pixel since it need to be low in leakage, and LTPS should be used as the TFTs of the peripheral driver circuit since they need to have a high carrier mobility rate. In the LTPS forming process, if the LTPS is to be connected to drain and source electrodes, it is necessary to form through-holes in an insulating film covering the LTPS and perform HF cleaning for the purpose of removing the remaining oxides from the surfaces of the LTPS in the through-holes.

Figure 3:
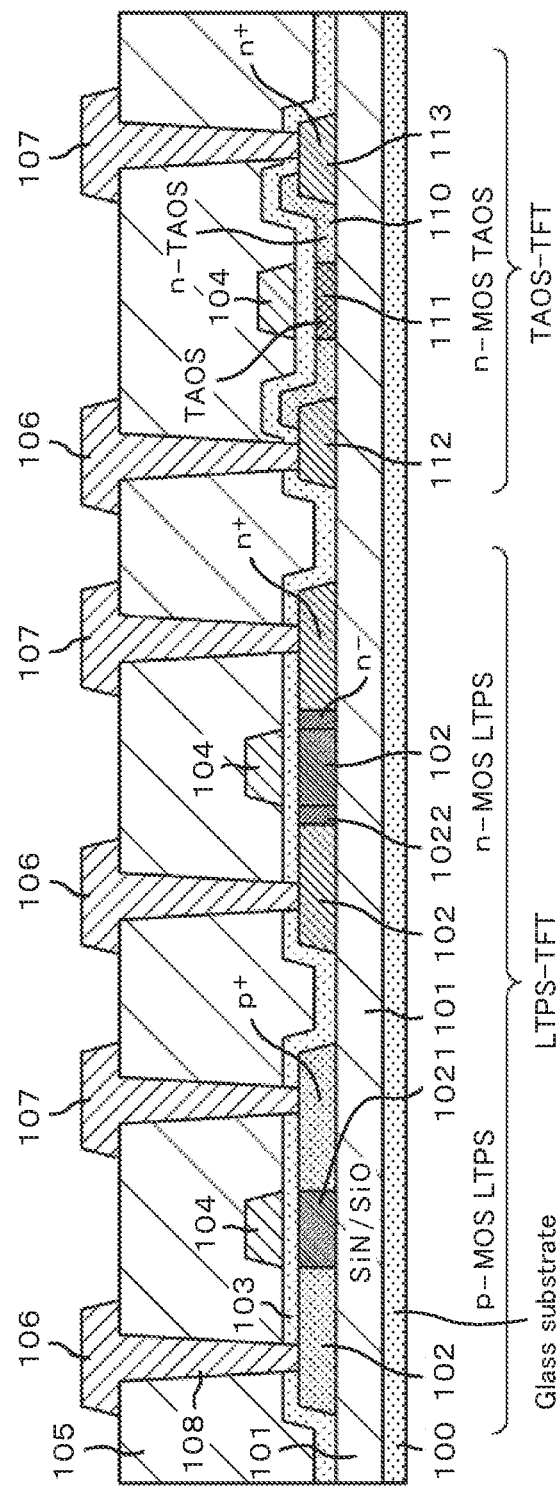
FIG. 3 is a cross section illustrating a TFT structure according to the invention.

However, if this same fabrication process is applied to TFTs made of a TAOS, the TAOS will dissolve in HF, rendering the formation of the TFTs impossible. Thus, this problem needs to be solved in order to form LTPS TFTs and TAOS TFTs on the same substrate. FIG. 3 illustrates a TFT structure according to the invention that is deigned to solve the problem. FIGS. 4 through 12 illustrate the process for producing the structure of FIG. 3.

As illustrated in FIG. 3, LTPS TFTs and a TAOS TFT are formed on the same substrate 100. The LTPS TFTs are used for the peripheral driver circuit and include a p-MOS and an n-MOS. By contrast, the TAOS TFT is used as the switching TFT of a pixel in the display area.

A distinctive feature of the invention lies in the structure of the TAOS TFT. In order to connect the TAOS TFT to the pixel electrode or a video signal line, it is necessary to create through-holes 108 in an inter-layer insulating film 105 formed above the TFT. In the invention, although the TAOS TFT is formed of a TAOS 110, the material connected in a through-hole 108 to the pixel electrode or a video signal line is not the TAOS 110 but LTPS 112 or LTPS 113. This prevents contact between the TAOS and HF during HF cleaning of the through-holes. Therefore, the TAOS TFT will not be destroyed by the HF.

Figure 4:
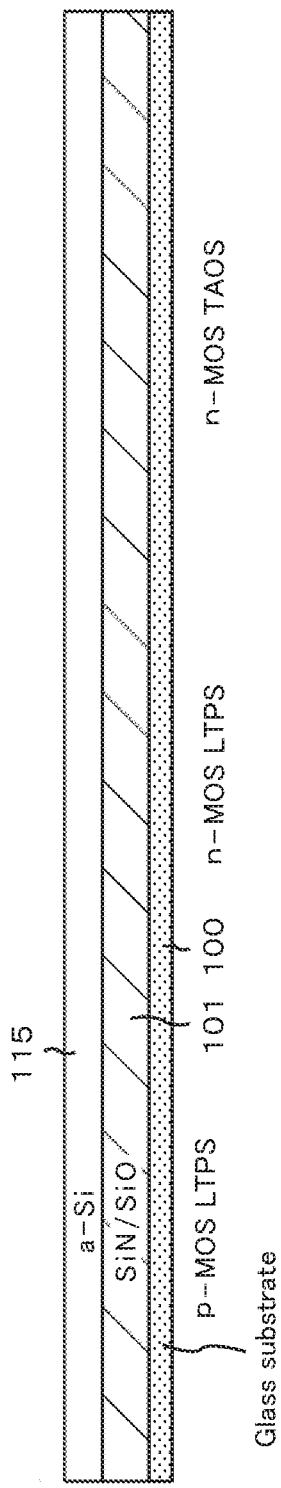
FIG. 4 is a cross section illustrating the formation of an undercoat and a-Si on a substrate.
Figure 5:
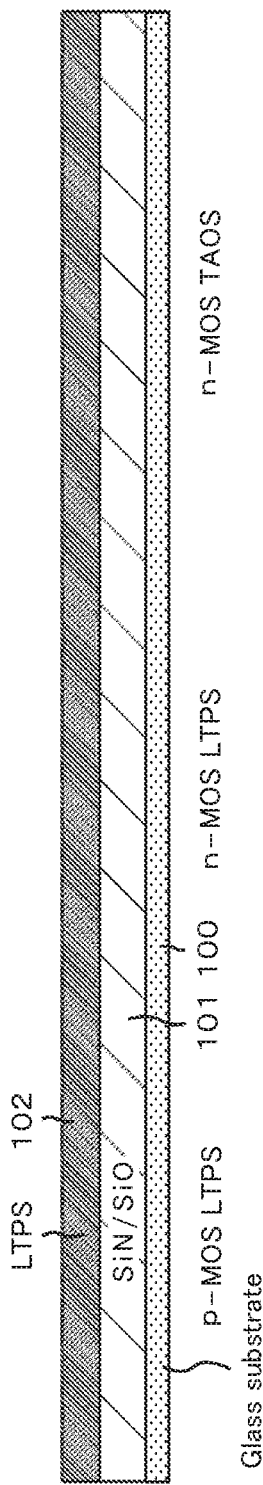
FIG. 5 is a cross section illustrating the conversion of the a-Si into poly-Si by a laser beam.

Referring FIGS. 4 through 12, we now describe the process for producing the structure of the invention shown in FIG. 3. In FIG. 4, an undercoat 101 is formed of SiNx (or SiN) and SiOx (or SiO$_2$) on the TFT substrate 100 made of glass. The purpose of the undercoat 101 is to prevent impurities in the glass substrate from contaminating the semiconductor layer constituting TFTs. The SiNx is, for example, 50-nm thick while the SiOx is 300-nm thick. Formed on the undercoat 101 is a-Si (amorphous (non-crystalline) silicon) 115. The SiNx, SiOx, and a-Si are formed successively by CVD. The a-Si is approximately 50 nm in thickness. As illustrated in FIG. 5, the a-Si 115 is converted into LTPS 102 by irradiating it with an excimer laser beam.

Figure 6:
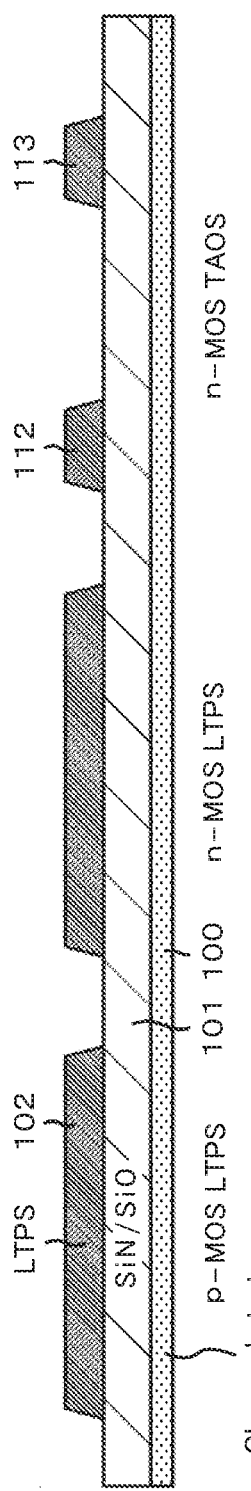
FIG. 6 is a cross section illustrating the poly-Si layer after patterning.

Thereafter, as illustrated in FIG. 6, LTPS islands are formed by photolithography. The TFTs to be formed include the following three TFTs: a p-MOS TFT made of LTPS (p-MOS LTPS); an n-MOS TFT made of LTPS (n-MOS LTPS); and an n-MOS TFT made of a TAOS (n-MOS TAOS). In the LTPS patterning, the drain and source electrodes of the n-MOS TAOS are formed simultaneously because they are formed of LTPS.

Figure 7:
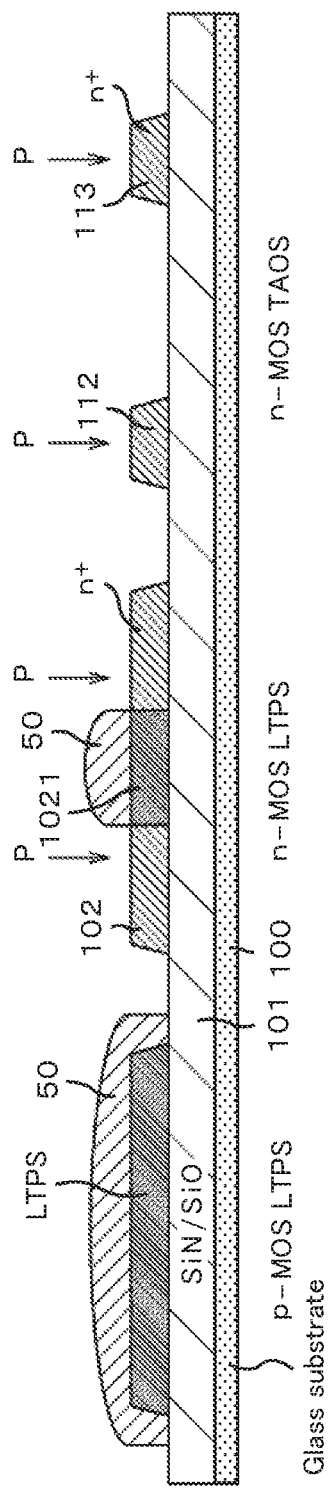
FIG. 7 is a cross section illustrating ion implantation of phosphorous (P) being performed.

Thereafter, as illustrated in FIG. 7, a photoresist 50 is formed over the entire p-MOS LTPS and the channel section 1021 of the n-MOS LTPS. The LTPS 102 is then doped with P by ion implantation, thereby converting the region of the LTPS 102 that is not covered by the photoresist 50 into n+. This results in formation of the drains and sources of the n-MOS LTPS and n-MOS TAOS.

Figure 8:
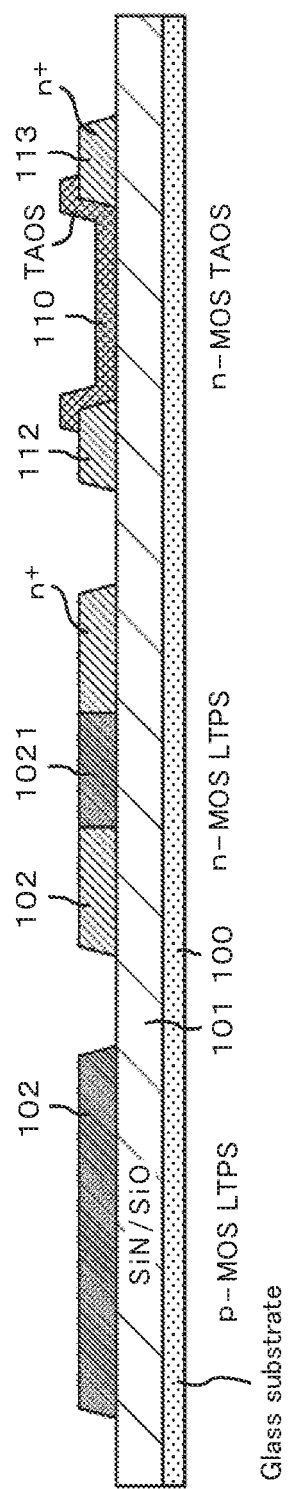
FIG. 8 is a cross section illustrating the formation of a TAOS.
Figure 9:
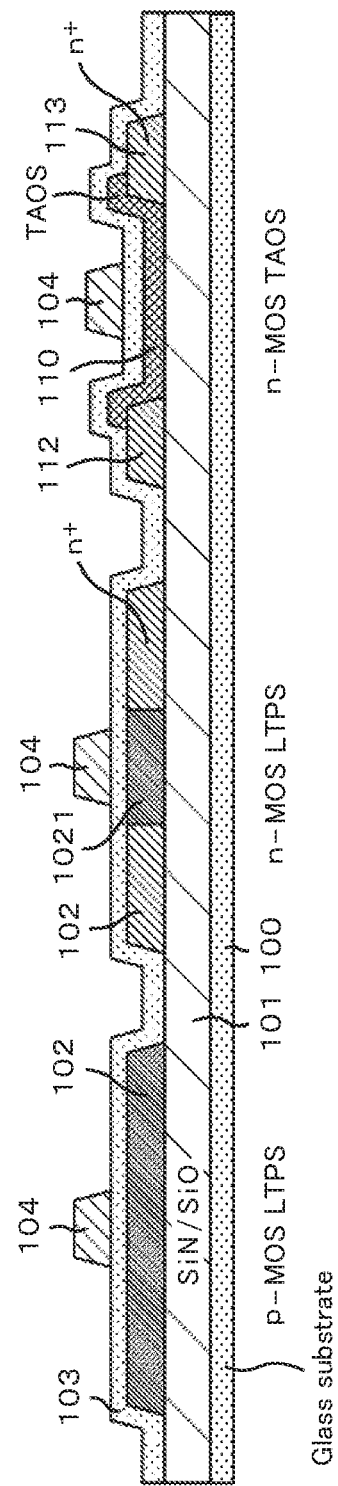
FIG. 9 is a cross section illustrating the formation of a gate insulating film and gate electrodes on the insulating film.

Thereafter, as illustrated in FIG. 8, a TAOS 110 is formed at the n-MOS TAOS TFT section. The TAOS 110 is formed across the range of, for example, 10 to 100 nm. Examples of the material of the TAOS 110 include IGZO, ITZO, ZnON, IZO, IGO, and ZnO. A gate insulating film 103 is then formed as illustrate in FIG. 9. The gate insulating film 103 is formed of SiOx (SiO$_2$) by CVD in which tetraethoxysilane (TEOS) is used. Formed on the gate insulating film 103 are gate electrodes 104.

Figure 10:
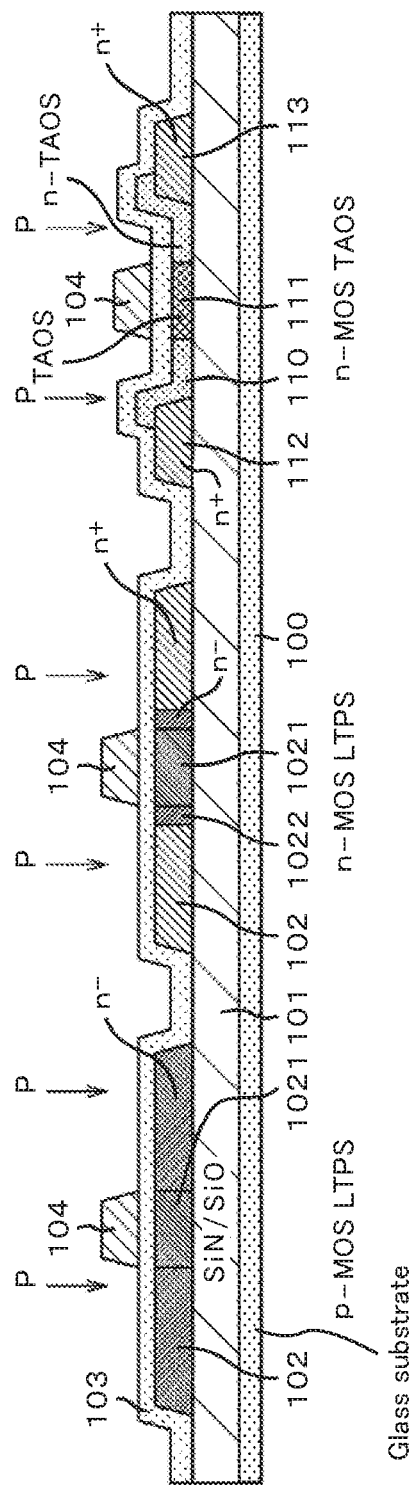
FIG. 10 is a cross section illustrating ion implantation of P being performed.

Thereafter, as illustrated in FIG. 10, phosphorous-doping (P-doping) is performed through ion implantation in which the gate electrodes 104 are used as masks. This results in formation of an n– drain and source for the p-MOS LTPS. The drain and source of the n-MOS LTPS are converted into n+. In the n-MOS LTPS, the regions of the LTPS 102 that had been covered by the photoresist 50 but are not covered by the gate electrode 104 become n–. These regions are formed on the two opposite sides of the channel 1021 and are referred to as lightly doped drain regions 1022 (or simply LDD 1022). The LDD layer 1022 decreases the intensity of an electric filed between the channel and source or between the channel and the drain, thereby preventing dialectic breakdown at those regions. As illustrated in FIG. 10, in the n-MOS TAOS, the regions of the TAOS that are not covered by the gate electrode 104 are converted into n– TAOS by the P-doping and made electrically conductive.

Figure 11:
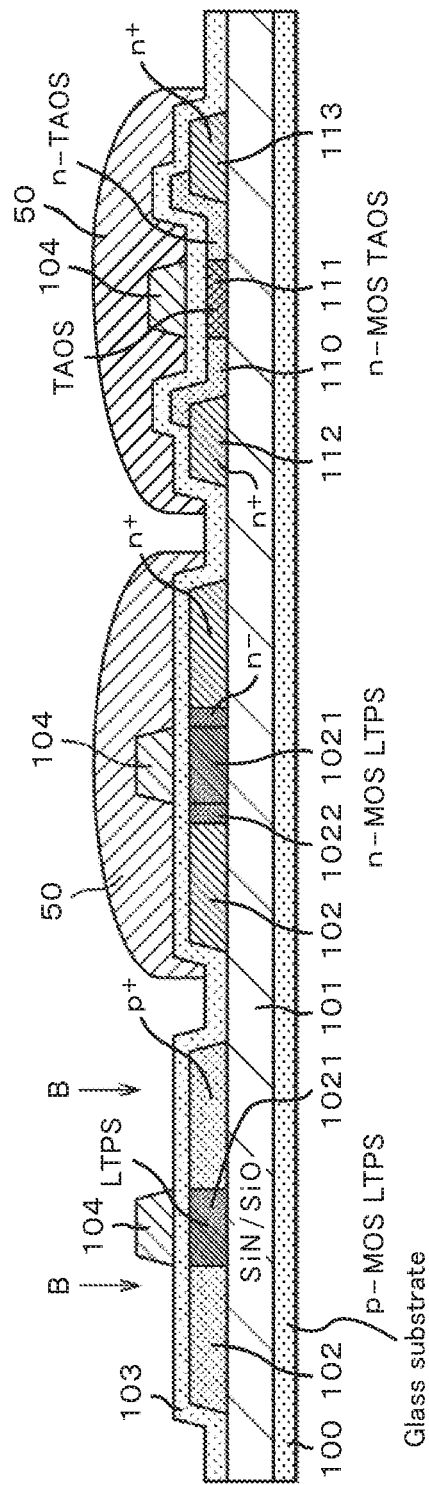
FIG. 11 is a cross section illustrating ion implantation of boron (B) being performed.

Thereafter, as illustrated in FIG. 11, a photoresist 50 is formed to cover the n-MOS LTPS and n-MOS TAOS. The p-MOS LTPS is then doped with B by ion implantation in which the gate electrode 104 is used as a mask. This converts the drain and source of the p-MOS LTPS into p+, making them sufficiently conductive.

Figure 12:
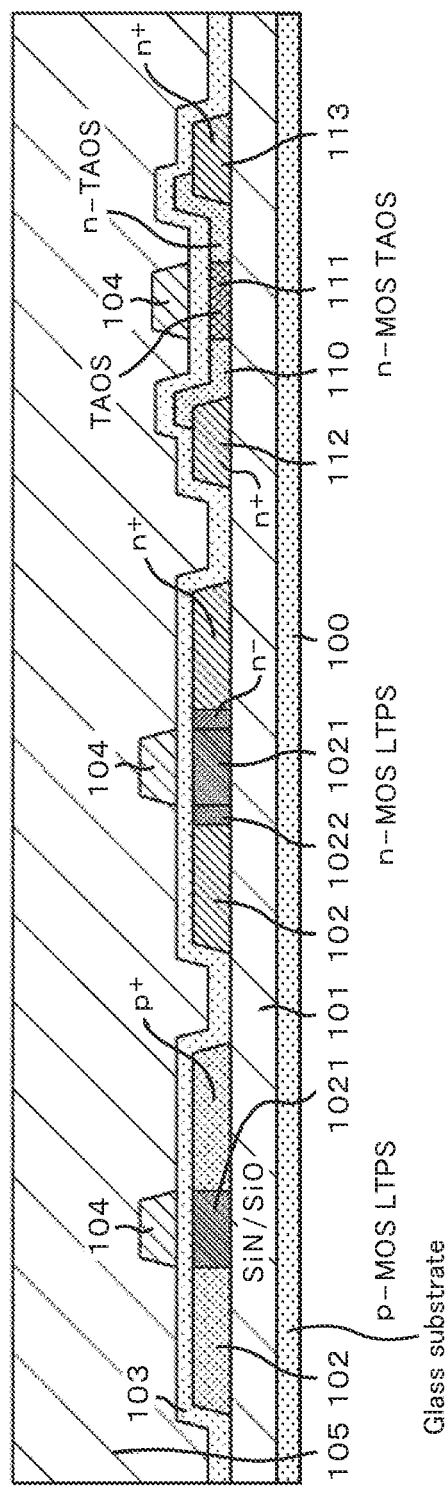
FIG. 12 is a cross section illustrating the formation of an inter-layer insulating film.

The photoresist 50 is then removed, followed by the formation of the inter-layer insulating film 105 as illustrated in FIG. 12. The inter-layer insulating film 105 covers all the TFTs and is formed of SiNx by CVD.

Referring back to FIG. 3, through-holes 108 are then formed in the inter-layer insulating film 105. Drain electrodes 106 and source electrodes 107 are formed in the through-holes 107. The drain electrodes 106 are connected to, for example, video signal lines while the source electrode 107 are connected to pixel electrodes. Each of the drain electrodes 106 and source electrodes 107 is formed of, for example, a Ti/Al alloy/Ti layer (i.e., three-layered structure). Ti is used to prevent formation of hillocks from the Al alloy. Ti can be replaced by Mo or W alloy.

After the formation of the through-holes 108 and before the formation of the drain electrodes 106 and source electrode 107, HF cleaning is performed to remove the remaining oxide film from the surface of the LTPS. With conventional technology, it is impossible to simultaneously form LTPS TFTs and a TAOS TFT because the TAOS dissolves in HF. In the invention, by contrast, LTPS 112 and LTPS 113 are formed as the drain and source of the TAOS TFT, and through-holes are formed above the LTPS 112 and LTPS 113. Therefore, the drain and source of the TAOS TFT do not dissolve in HF.

As described above, the invention allows simultaneous formation of the LTPS TFTs and the TAOS TFT on the same substrate. This means that the TFT suitable for the pixel region and the TFTs suitable for the driver circuit can be formed simultaneously.

Figure 13:
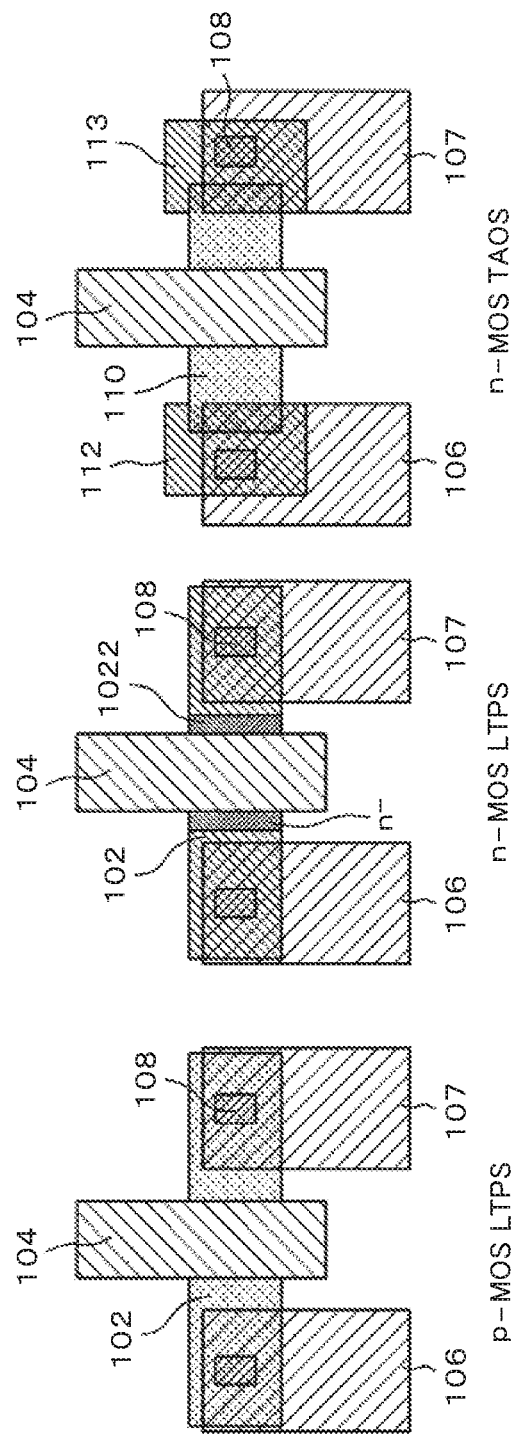
FIG. 13 is a plan view of TFTs according to the invention.

FIG. 13 is a plan view of the TFTs of FIG. 3. The TFTs shown in FIG. 13 are, from left to right, the p-MOS LTPS, n-MOS LTPS, and n-MOS TAOS. In the n-MOS TAOS as well, LTPS is formed where through-holes 108 are created; therefore, these through-holes 108 can be created with the same process as for the p-MOS LTPS and n-MOS LTPS.

Embodiment 2

Figure 14:
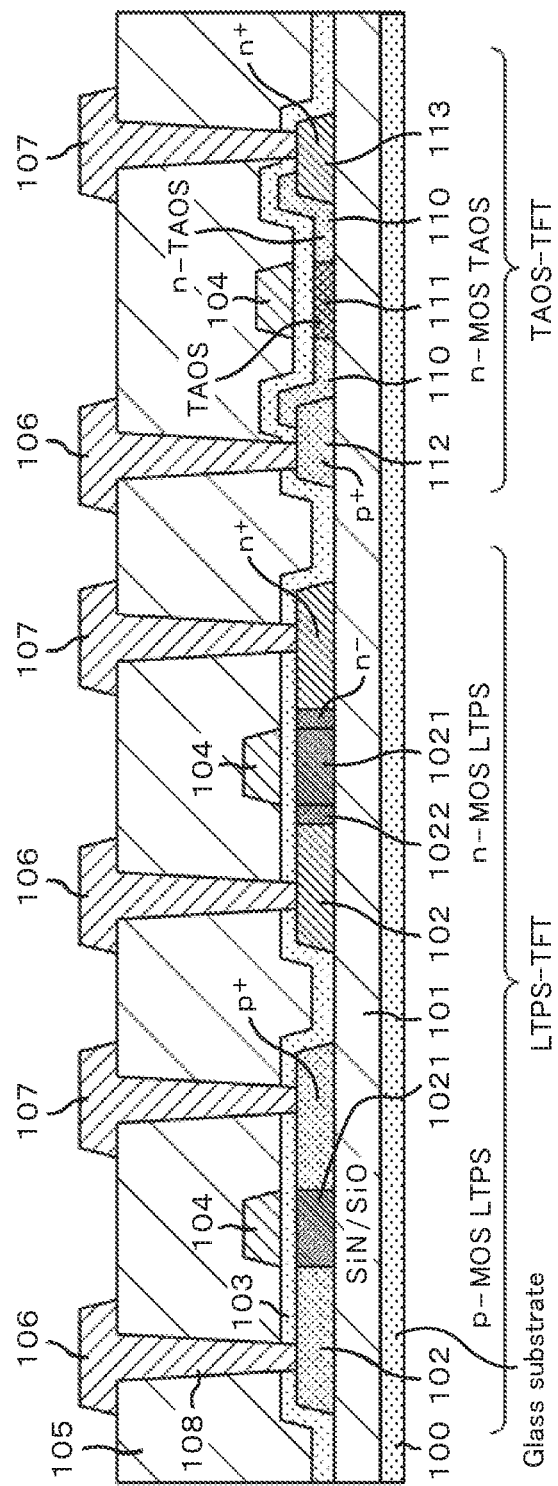
FIG. 14 is a cross section of TFTs according to an embodiment 2 of the invention.

FIG. 14 is a cross section according to Embodiment 2 of the invention. The drain electrode 112 of the n-MOS TAOS of FIG. 14 has a structure different from that of FIG. 3. As illustrated in FIG. 14, the LTPS 112 constituting the drain of the n-MOS TAOS is p+ while the TAOS 110 is n−. Thus, a p-n junction diode is formed between the TAOS and the LTPS constituting the drain.

This diode prevents current leakage. In the display area of a liquid crystal display device, the sources and drains of the TFTs periodically switch their functions. Therefore, leakage can be prevented when a data signal is either + or −. In other words, the p-n junction can reduce leakage current to half.

In the case of organic EL display devices, the positive and negative signs of data signals do not change. Thus, leakage current can be reduced considerably by forming a p-n junction either on the drain side or source side of the n-MOS TAOS of FIG. 14.

Figure 15:
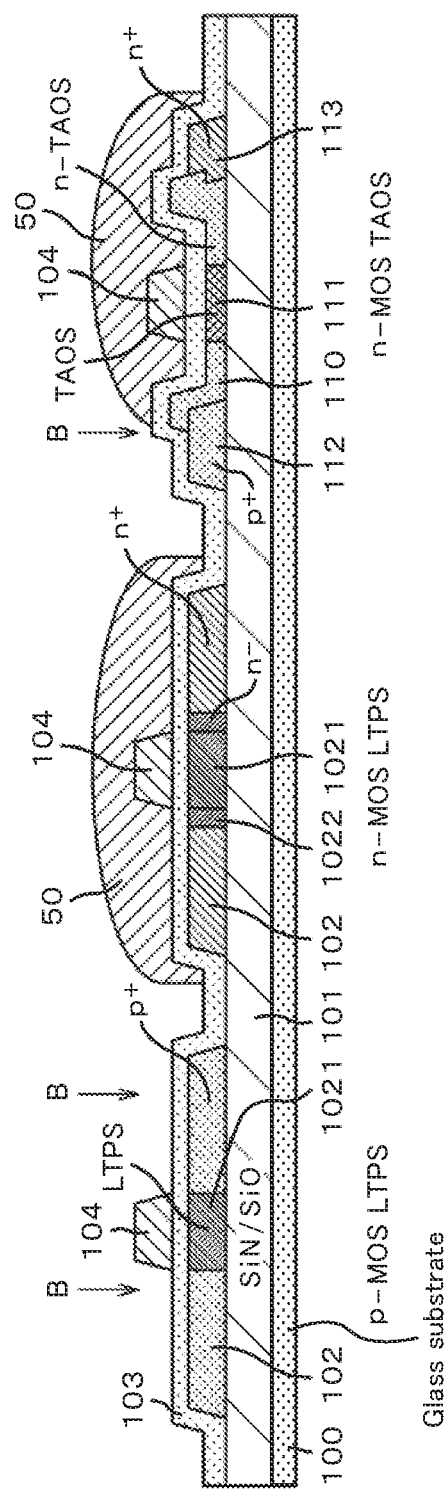
FIG. 15 is a cross section illustrating ion implantation of B being performed.
Figure 16:
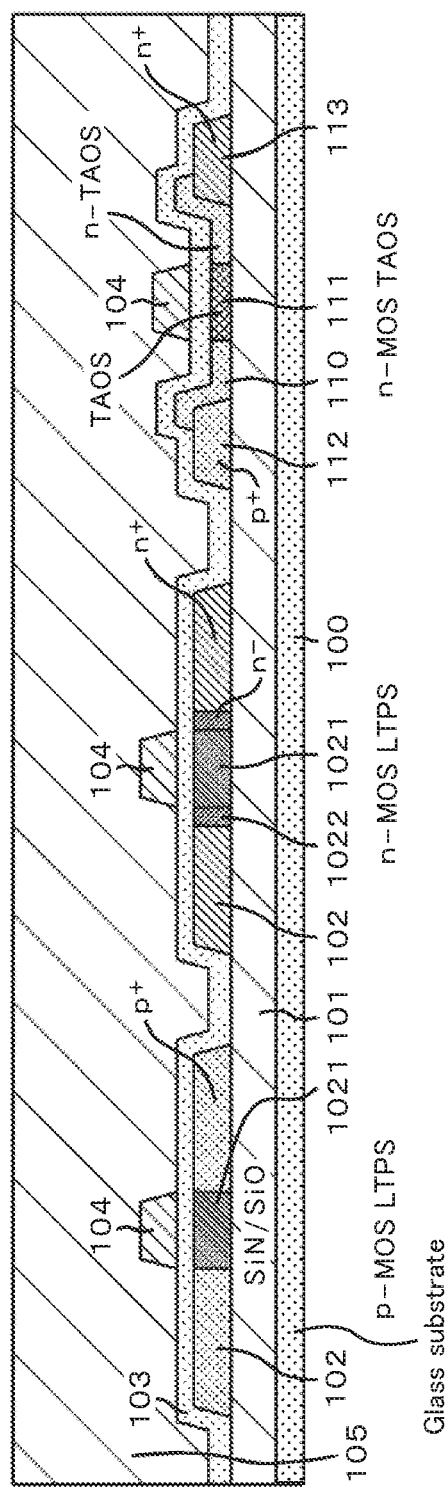
FIG. 16 is a cross section illustrating the formation of an inter-layer insulating film.

FIGS. 15 and 16 illustrate an example of the process for forming the structure of FIG. 14. Embodiment 2 includes the same steps as those illustrated in FIGS. 4 through 10 related to Embodiment 1. That is, Embodiment 2 includes the steps of forming the undercoat 101 and the a-Si 115 on the glass substrate 100 (FIG. 4), converting the a-Si 115 into poly-Si by laser annealing, forming the TAOS, forming the gate electrodes 104 on the gate insulating film 103, and performing P-doping through ion implantation.

In FIG. 15, a photoresist 50 is formed to cover the n-MOS LTPS and n-MOS TAOS, and the drain and source of the p-MOS LTPS is then doped with B by ion implantation. FIG. 15 differs from FIG. 11 related to Embodiment 1 in that, in the former, the photoresist 50 does not cover the LTPS 112 constituting the drain of the n-MOS TAOS, and in that the LTPS drain 112 is converted into p+ through ion implantation. As a result, a p-n junction is formed between the LTPS drain 112 and the TAOS 110.

Thereafter, as illustrated in FIG. 16, the inter-layer insulating film 105 is formed in such a way as to cover each TFT. Similar to Embodiment 1, the through-holes 108 are then formed in the inter-layer insulating film 105, followed by HF cleaning of the through-holes 108 and by the formation of the drain electrodes 106 and the source electrodes 107. In Embodiment 2 as well, LTPS is formed at the regions of the n-MOS TAOS where through-holes 108 are created. Therefore, the TAOS 110 does not dissolve at those through-holes 108.

Although, in Embodiment 2, the p-n junction is formed on the side of the LTPS drain 112 of the n-MOS TAOS, the p-n junction can instead be formed on the side of the LTPS source 113. As described above, Embodiment 2 allows formation of a reliable, low-leakage TAOS TFT.

Embodiment 3

Figure 17:
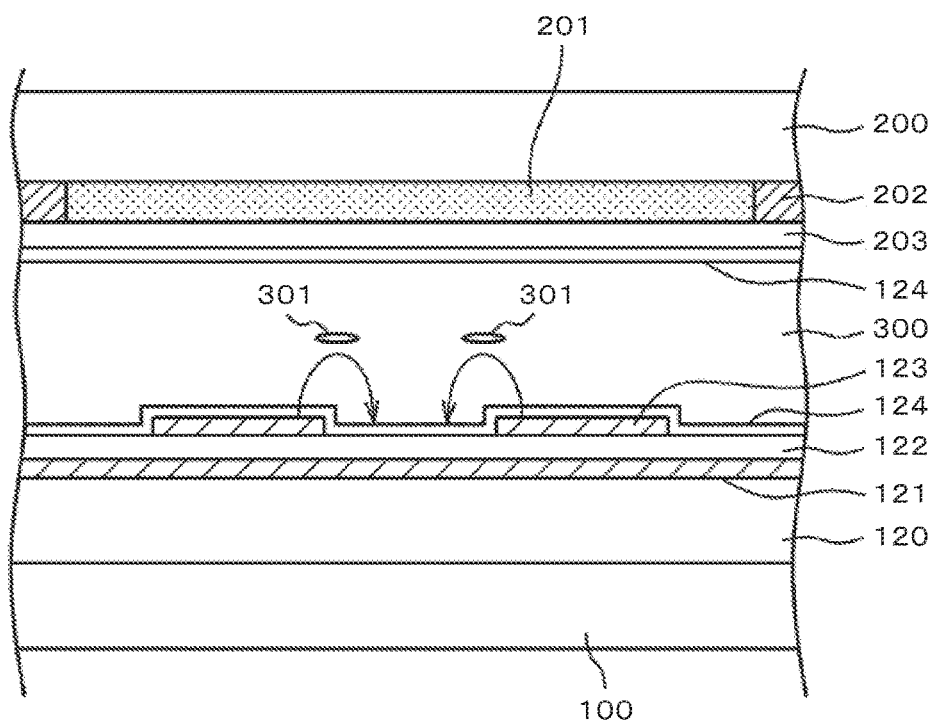
FIG. 17 is a cross section of a liquid crystal display device.

FIG. 17 is a cross section illustrating a case where the n-MOS TFTs of Embodiments 1 and 2, made of a TAOS, are applied to the display area. In FIG. 17, a TFT array layer 120 is formed on the TFT substrate 100. The TFT array layer 120 has the layer structure of the TAOS TFT illustrated in FIGS. 3 and 14, and an organic passivation film is formed on the TFT array layer 120.

The liquid crystal display device of FIG. 17 is of the in-plane switching (IPS) type, and a planar common electrode 121 is formed on the TFT array layer 120. A capacitor insulating film 122 is formed to cover the common electrode 121, and a pixel electrode 123 is formed on the capacitor insulating film 122. The pixel electrode 123 is in the form of a comb or strips and covered by an alignment film which is formed to initially align liquid crystal molecules 301.

Application of a data signal between the pixel electrode 123 and the common electrode 121 results in the electric force lines illustrated by the arrows. This electric field causes the liquid crystal molecules 301 to rotate, thereby controlling the amount of light passing through a liquid crystal layer 300 to produce an image.

As illustrated in FIG. 17, the counter substrate 200 is located across from the glass substrate 100 with the liquid crystal layer 300 inserted therebetween. Underneath the counter substrate 200 are a color filter 201 and a black matrix 202. An overcoat 203 is formed to cover the color filter 201 and the black matrix 202. Another alignment film 124 is formed to cover the overcoat 203 to initially align the liquid crystal molecules 301.

Figure 18:
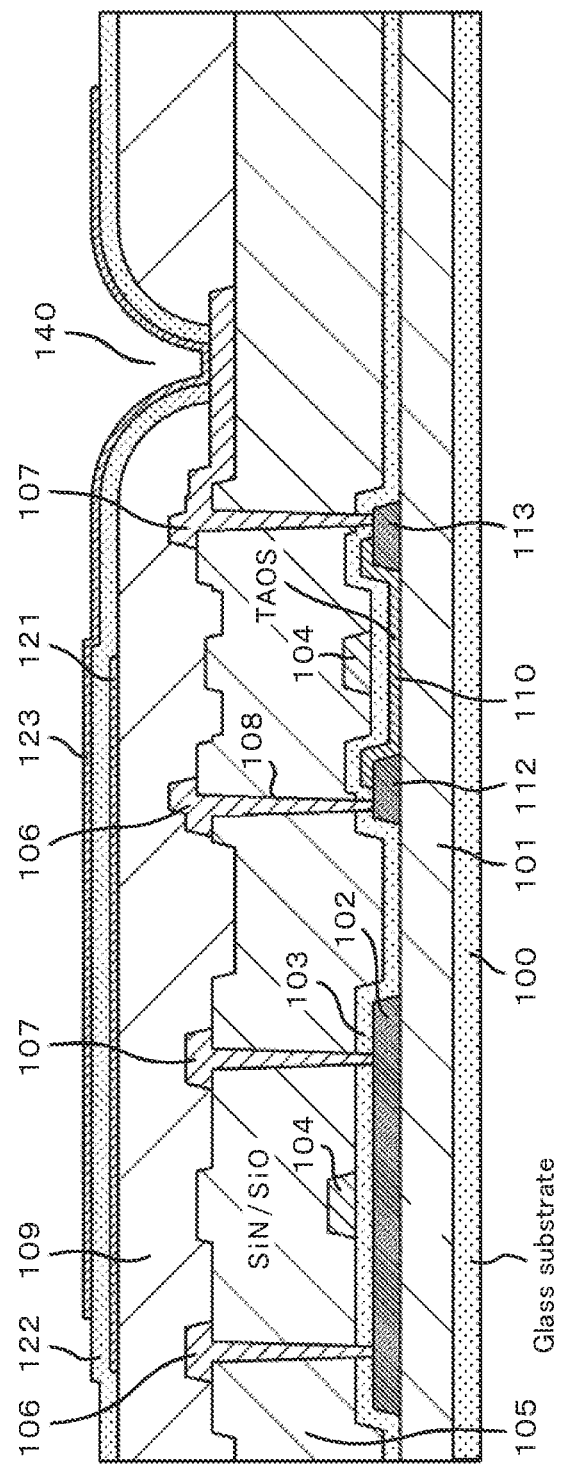
FIG. 18 is a cross section of a liquid crystal display device according to another embodiment of the invention.

FIG. 18 illustrates another example of the TFT array layer 120 of FIG. 17. In FIG. 18, an LTPS TFT and TAOS TFT are connected in series as the switching TFT of a pixel. In FIG. 18, the left one is the LTPS TFT while the right one is the TAOS TFT.

As illustrated in FIG. 18, an organic passivation film 109 is formed to cover the TFTs. The planar common electrode 121 is formed on the organic passivation film 109, and the capacitor insulating film 122 is formed to cover the common electrode 121. Formed on the capacitor insulating film 122 is the pixel electrode 123, which is in the form of a comb or strips.

In FIG. 18, the pixel electrode 123 is connected to the source electrode 107 that extends from the TAOS TFT, via a through-hole 140 formed in the organic passivation film 109 and the capacitor insulating film 122. According to the invention, the same fabrication process can be used for the LTPS TFT and TAOS TFT. Thus, as illustrated in FIG. 18, LTPS TFTs and TAOS TFTs can be combined in various ways, depending on the purpose.

In a liquid crystal display device, when a data signal is written on a pixel electrode 123, voltage is maintained for the duration of a frame by the storage capacitor created by the pixel electrode 123, common electrode 121, and capacitor insulating film 122. If the leakage current from its TFT is large, the voltage of the pixel electrode 123 changes, which causes flickering and makes it impossible for the liquid crystal display device to produce high quality images. By contrast, the use of the TAOS TFT of the invention makes it possible to create a low-leakage liquid crystal display device that produces high quality images.

Embodiment 4

Figure 19:
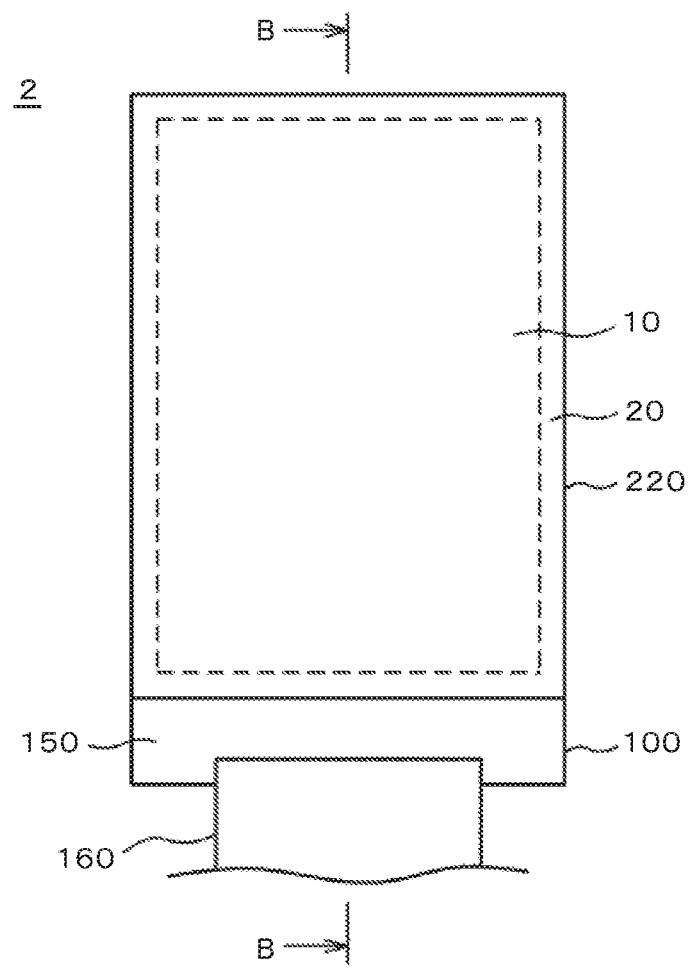
FIG. 19 is a plan view of an organic electroluminescent (EL) display device.

The combination of the LTPS TFT and TAOS TFT of Embodiments 1 and 2 can also be applied to organic EL display devices. FIG. 19 is a plan view of an organic EL display device 2. As illustrated in FIG. 19, the display area 10 and the peripheral circuit area 20 are formed. Formed in the display area 10 are organic EL driver TFTs and switching TFTs. For the switching TFTs, low-leakage TAOS TFTs are suitable. The peripheral driver circuit is formed of TFTs, and LTPS TFTs are primarily used.

In FIG. 19, an anti-reflective polarizer 220 is glued to the display area 10 so as to cover it. Because reflective electrodes are used in the organic EL display device, the polarizer 220 is provided for the purpose of preventing reflection of external light. The section of the TFT substrate 100 on which the display area 10 is not present serves as the terminal section 150. The flexible wiring substrate 160 is connected to the terminal section 150 to supply electric power and signals to the organic EL display device.

Figure 20:
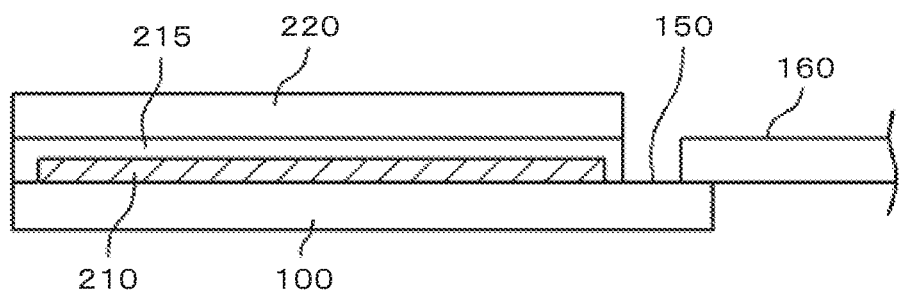
FIG. 20 is a cross section taken along line B-B of FIG. 19.

FIG. 20 is a cross section taken along line B-B of FIG. 19. In FIG. 20, a display element layer 210 including an organic EL layer is formed on the TFT substrate 100. The display element layer 210 corresponds to the display area 10 in FIG. 19 in terms of size. Because organic EL materials are decomposed by moisture, a protective layer 215, made of SiNx or the like, is formed on the display element layer 210 for the purpose of preventing entry of moisture from the outside. The above polarizer 220 is glued to the protective layer 215. The section of the TFT substrate 100 above which the display element layer 210 is not present serves as the terminal section 150, to which the flexible wiring substrate 160 is connected.

Figure 21:
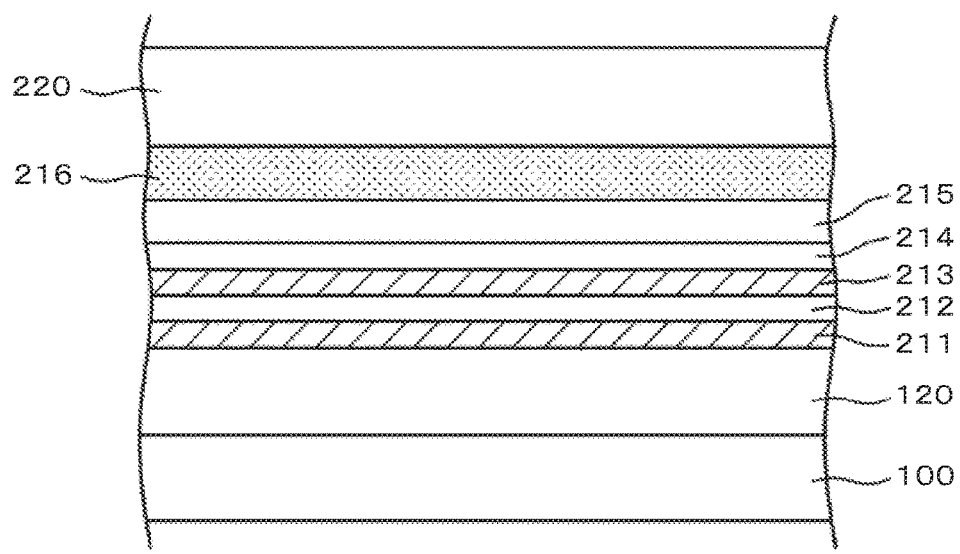
FIG. 21 is a cross section of an organic EL display device.

FIG. 21 is a cross section of the display area of the organic EL display device. As illustrated in FIG. 21, the TFT array layer 120 is formed on the TFT substrate 100. The TFT array layer 120 has the layer structure of the TAOS TFT illustrated in FIGS. 3 and 14, and the organic passivation film 109 is formed on the TFT array layer 120.

Also in FIG. 21, a reflective electrode 211, made of Al alloy or the like, is formed over the TFT array layer 120, and a lower electrode 212, made of indium tin oxide (ITO) or the like, is formed on the reflective electrode 211. Formed on the lower electrode 212 is an organic EL layer 213, which includes, for example, an electron injection layer, an electron transport layer, a light emitting layer, a hole transport layer, and a hole injection layer. Formed on the organic EL layer 213 is an upper electrode 214, which acts as a cathode. The upper electrode 214 can be formed of a transparent conductive film such as IZO and ITO or of a metal thin film such as a silver film. The protective layer 215, made of SiNx or the like, is formed on the upper electrode 214, and the anti-reflective polarizer 220 is glued to the protective layer 215 by an adhesive 216.

Various TFTs are formed in the TFT array layer 120 such as driver TFTs and switching TFTs. Since the invention allows formation of LTPS TFTs and TAOS TFTs through the same process, those TFTs can be combined in various ways. This makes it possible to create an organic EL display device that is capable of creating high quality images and reducing power consumption.

While we have stated that the LTPS TFTs of Embodiments 1 and 2 of the invention are the combination of an n-MOS TFT and a p-MOS TFT, the invention is not limited thereto. Instead, both can be n-MOS TFTs or p-MOS TFTs, depending on the product requirements or fabrication process requirements.

In addition, while we have stated that TAOS TFTs are used for the display area and that LTPS TFTs are used for the peripheral driver circuit, TAOS TFTs can be added to the peripheral circuit or LTPS TFTs can be added to the display area, depending on the product requirements.

Moreover, while we have stated that the TAOS TFT of Embodiments 1 and 2 of the invention is an n-MOS TFT, the invention is not limited to such a case. The TAOS TFT can instead be a p-MOS TFT. In either case, by using LTPS for the drain and source of the TAOS TFT, the same fabrication process as for LTPS TFTs can be used.

What is claimed is:

1. A manufacturing method of a display device, which has a first TFT (Thin Film Transistor) using oxide semiconductor for a first semiconductor layer, a second TFT using polysilicon for a second semiconductor layer and a third TFT using polysilicon for a third semiconductor layer, comprising:
    forming an amorphous silicon layer on a substrate, and subsequently transforming the amorphous silicon layer to a polysilicon layer,
    patterning the polysilicon layer into the second semiconductor layer, the third semiconductor layer, and a drain electrode base and a source electrode base for the first TFT simultaneously by photo lithography,
    forming a first photo resist on a whole of the second semiconductor layer and on a channel of the third semiconductor layer,
    doping Phosphor (P) by first ion implantation into an area not covered by the first photo resist,
    removing the first photo resist, and subsequently, forming an oxide semiconductor layer to form the first TFT,
    forming a gate insulating film covering the first, the second and the third semiconductor layers; a gate electrode is formed over each of the first, the second and the third semiconductor layers,
    doping Phosphor (P) by the second ion implantation using the gate electrode as a mask,
    covering the first TFT and the third TFT by a second photo resist; doping Boron (B) by third ion implantation into the second semiconductor layer using the gate electrode as a mask,
    removing the second photo resist, then, forming an interlayer insulating film, subsequently, forming through holes in the interlayer insulating film to form a drain electrode and a source electrode.

2. The manufacturing method of a display device according to claim 1,
    wherein forming an undercoat on the substrate before forming the amorphous silicon.

3. The manufacturing method of a display device according to claim 1,
wherein the oxide semiconductor is made of either one of IGZO, ITZO, ZnON, IZO, IGO or ZnO.

4. The manufacturing method of a display device according to claim 1,
wherein a thickness of the oxide semiconductor layer is 10 nm to 100 nm.

5. The manufacturing method of a display device according to claim 1,
wherein cleaning the through holes with hydrogen fluoride to remove a surface oxide of the polysilicon layer before forming the drain electrode and the source electrode.

6. The manufacturing method of a display device according to claim 1,
wherein the display device is a liquid crystal display device.

7. The manufacturing method of a display device according to claim 1,
wherein the display device is an organic EL display device.

8. A manufacturing method of a display device, which has a first TFT (Thin Film Transistor) using oxide semiconductor for a first semiconductor layer, a second TFT using polysilicon for a second semiconductor layer and a third TFT using polysilicon for a third semiconductor layer, comprising:
forming an amorphous silicon layer on a substrate, and subsequently transforming the amorphous silicon layer to a polysilicon layer,
patterning the polysilicon layer into the second semiconductor layer, the third semiconductor layer, and a drain electrode base and a source electrode base for the first TFT simultaneously by photo lithography,
forming a first photo resist on a whole of the second semiconductor layer and on a channel of the third semiconductor layer,
doping Phosphor (P) by first ion implantation into an area not covered by the first photo resist,
removing the first photo resist, and subsequently, forming an oxide semiconductor layer to form the first TFT,
forming a gate insulating film covering the first, the second and the third semiconductor layers; a gate electrode is formed over each of the first, the second and the third semiconductor layers,
doping Phosphor (P) by the second ion implantation using the gate electrode as a mask,
covering the oxide semiconductor layer and either the drain electrode base or the source electrode base of the first TFT, and the third TFT by a second photo resist; doping Boron (B) by third ion implantation into the second semiconductor layer and another the drain electrode base or the source electrode base of the first TFT using the gate electrode as a mask,
removing the second photo resist, then, forming an interlayer insulating film, subsequently, forming through holes in the interlayer insulating film to form a drain electrode and a source electrode.

9. The manufacturing method of a display device according to claim 8,
wherein the display device is a liquid crystal display device.

10. The manufacturing method of a display device according to claim 8,
wherein the display device is an organic EL display device.

* * * * *